United States Patent
Korcz et al.

(10) Patent No.: US 8,759,674 B2
(45) Date of Patent: Jun. 24, 2014

(54) ELECTRICAL BOX WITH MULTI-DIRECTIONAL PARTITION PLATE

(75) Inventors: Krzysztof W. Korcz, Granger, IN (US); Steve J. Johnson, Spotsylvania, VA (US); Mahran H. Ayrton, South Bend, IN (US)

(73) Assignee: Hubbell Incorporated, Shelton, CT (US)

( * ) Notice: Subject to any disclaimer, the term of this patent is extended or adjusted under 35 U.S.C. 154(b) by 72 days.

(21) Appl. No.: 13/482,647

(22) Filed: May 29, 2012

(65) Prior Publication Data

US 2013/0319715 A1     Dec. 5, 2013

(51) Int. Cl.
*H02G 3/08*      (2006.01)
*H02G 3/12*      (2006.01)
*H05K 5/00*      (2006.01)

(52) U.S. Cl.
CPC .............. *H02G 3/08* (2013.01); *H02G 3/081* (2013.01); *H02G 3/121* (2013.01); *H05K 5/00* (2013.01)
USPC ............... 174/50; 174/480; 174/53; 220/3.2; 220/3.3

(58) Field of Classification Search
CPC ........... H02G 3/08; H02G 3/081; H02G 3/10; H02G 3/12; H02G 3/121; H02G 3/18; H02G 3/185; H02G 3/128; H02G 3/105; H05K 5/00; H05K 5/02; H01R 13/46
USPC ......... 174/480, 481, 50, 53, 57, 58, 486, 495, 174/496, 497, 498, 499; 220/3.2–3.9, 4.02, 220/529, 533, 545; 439/535, 536
See application file for complete search history.

(56) References Cited

U.S. PATENT DOCUMENTS

| | | | | |
|---|---|---|---|---|
| 1,929,844 A * | 10/1933 | Haas | | 220/3.9 |
| 3,472,945 A * | 10/1969 | Trachtenberg | | 174/53 |
| 3,587,906 A * | 6/1971 | Pepe | | 174/53 |
| 4,455,449 A | 6/1984 | Rendel | | |
| 5,257,487 A * | 11/1993 | Bantz et al. | | 174/486 |
| 5,486,650 A * | 1/1996 | Yetter | | 174/53 |
| 5,594,207 A * | 1/1997 | Fabian et al. | | 174/58 |
| 6,005,187 A * | 12/1999 | Navazo | | 174/481 |
| 6,268,564 B1 | 7/2001 | Miyakoshi | | |
| 6,395,981 B1 * | 5/2002 | Ford et al. | | 174/50 |
| 6,653,561 B2 | 11/2003 | Lalancette et al. | | |
| 7,038,126 B2 * | 5/2006 | Solet | | 174/50 |
| 7,038,132 B1 | 5/2006 | Lowe et al. | | |
| 7,075,004 B1 | 7/2006 | Gretz | | |
| 7,525,043 B1 | 4/2009 | Gretz | | |
| 7,825,336 B2 | 11/2010 | Peck | | |
| 8,273,998 B2 * | 9/2012 | Drane | | 174/58 |

(Continued)

*Primary Examiner* — Angel R Estrada
(74) *Attorney, Agent, or Firm* — Garrett V. Davis; Mark S. Bicks; Alfred N. Goodman

(57) ABSTRACT

An electrical box assembly includes an electrical box, a movable partition plate, and a cover having an opening for receiving and supporting an electrical wiring device such as a switch or duplex receptacle. The electrical box has a rear wall with a centrally located emboss having a plurality of screw holes for receiving a ground screw and ground wire. The partition plate has a recess for mating with the emboss and a top end for coupling with the cover member. The partition plate and cover member are adapted for coupling to the electrical box in different orientations so that the partition plate divides the electrical box into substantially equal size compartments for receiving high voltage and low voltage requirements.

26 Claims, 8 Drawing Sheets

(56) References Cited

U.S. PATENT DOCUMENTS 8,378,232 B2 * 2/2013 Drane .......................... 174/50
2009/0014196 A1 1/2009 Peck
2011/0005799 A1 1/2011 Drane
2011/0209913 A1 9/2011 Green et al.

* cited by examiner

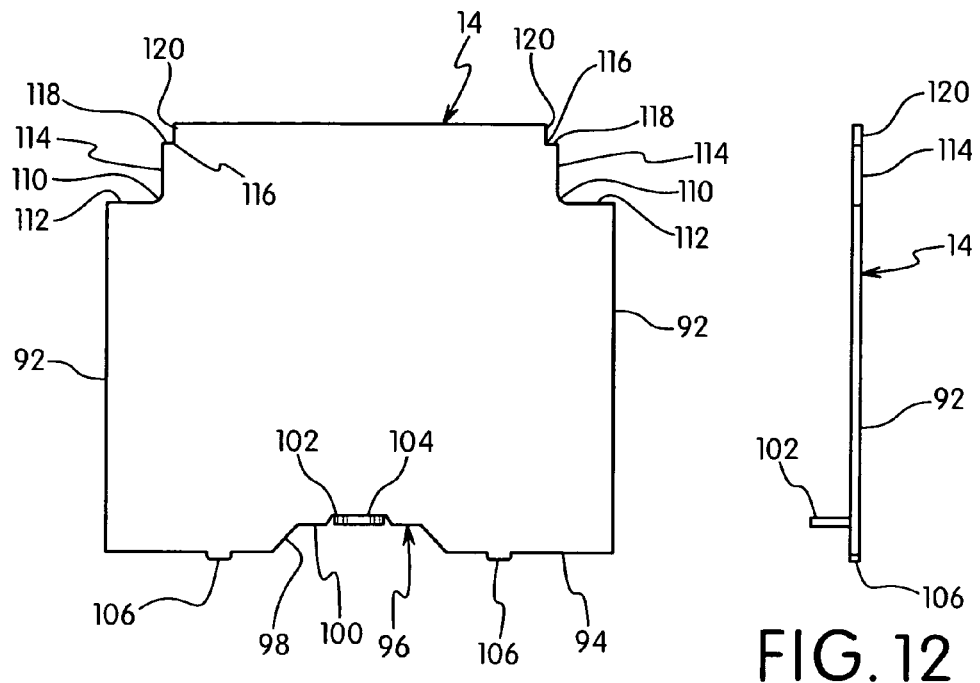
FIG. 11
FIG. 12
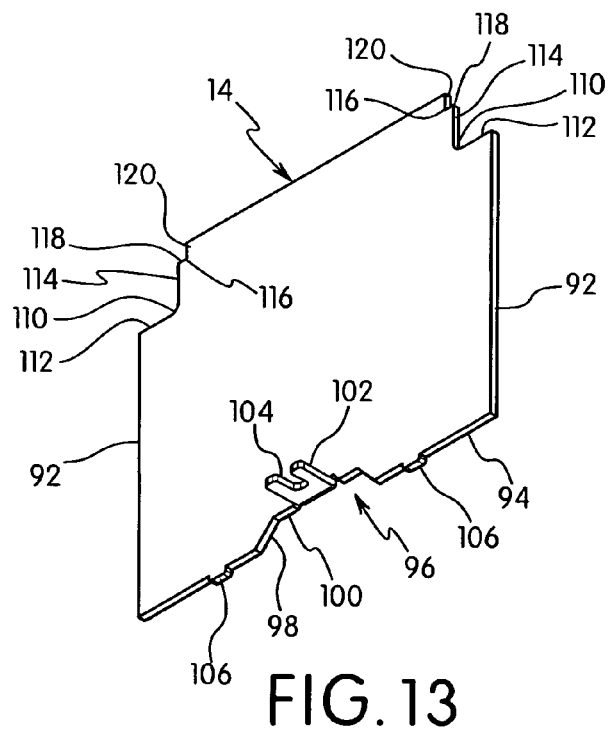
FIG. 13

ELECTRICAL BOX WITH MULTI-DIRECTIONAL PARTITION PLATE

FIELD OF THE INVENTION

The present invention is directed to an electrical box and electrical box assembly. The invention is particularly directed to an electrical box assembly having a multi-directional partition plate for forming a high voltage compartment and a low voltage compartment.

BACKGROUND OF THE INVENTION

Electrical boxes are known for receiving electrical wiring for various wiring devices. The electrical boxes can stand alone or can be recessed in a wall, ceiling, floor, or other surface.

Electrical boxes are also constructed for receiving high voltage wiring devices and low voltage wiring devices such as data and telephone receptacles. Boxes that receive both high voltage and low voltage require a divider to separate the high voltage and low voltage compartments.

An example of an electrical box is disclosed in U.S. Pat. No. 6,218,613 to Justiniano et al. The electrical box includes a flexible, isolation barrier installed into a standard double-gang device box to divide the available wiring space within the box into two separate compartments, one for communications conductors and the other for power conductors. The isolation barrier is either a stand-alone structure that attaches to the inside surface of a wall plate or it is integral with a separate chamber inserted into the box. As the isolation barrier is inserted into the box, its free end contacts the rear wall of the box and flexes while remaining in contact with the rear wall of the box, thus permitting the barrier to be used in device boxes having different depths.

An electrical box having the interior of the box divided into separate high and low voltage compartments is disclosed in U.S. Pat. No. 7,038,132 to Lowe et al. This patent discloses an outlet box that incorporates two separate boxes for accommodating both line and signal voltage wiring. A flush box, which substantially resembles a typical single-gang receptacle box, includes a flange cover that attaches the flush box to a recessed box. When the flush box and recessed box are connected together, a portion of the flush box resides within the recessed box and a second portion remains outside the recessed box. An L-shaped movable barrier separates the space within the recessed box into a line voltage chamber and a signal voltage chamber.

U.S. Patent Publication No. 2009/0014196 to Peck discloses a wall box having a planar divider to divide the box into two chambers of equal volume and intersects a knockout. The divider intersects the entire interior volume of the box, including the knockout located in the back wall of the box, so that the entire area of the opening corresponding to the knockout is not available for wiring that enters either chamber.

U.S. Pat. No. 4,455,449 to Rendel discloses a universal high and low voltage kit for use in a junction wiring box. The kit includes a partition plate with a pair of bottom flanges or legs for receiving a screw. The screws are threaded into screw holes. The partition plate is able to be mounted within the electrical box in two orientations 90° with respect to each other.

U.S. Pat. No. 6,268,564 to Miyakoshi discloses a connector bracket having a plurality of partition walls. The partition walls slide within grooves formed in the inner edge of the connector. The partition walls also include grooves for receiving dividers extending between the partition walls.

U.S. Pat. No. 6,653,561 to Lalancette et al. discloses an electrical box and partition plate. The plate has a transverse mounting bracket with a raised concave surface to prevent attachment of a ground screw.

U.S. Pat. No. 7,038,132 to Lowe et al. discloses the combination outlet box for line voltage and low voltage wiring within a standard single gang electrical outlet box. The combination includes a flush box, a recessed box, and an L-shaped movable barrier. The flush box resembles a standard plastic electrical box that fits within the flush box. The L-shaped barriers position the flush box within the recessed box and by the compartments within the recessed box.

U.S. Pat. No. 7,075,004 to Gretz discloses and integral low voltage/high voltage electrical box having a fixed divider positioned between compartments of the electrical box.

U.S. Pat. No. 7,525,043 to Gretz discloses a two-gang recessed electrical box for recessing a high voltage component and a low voltage component. The electrical box assembly includes a frame with a rearward extending collar and a peripheral flange extending inwardly. A high voltage compartment and a low voltage compartment are provided at the rear of the frame member. The high voltage compartment has an electrical box extending rearward from the peripheral flange.

U.S. Pat. No. 7,825,336 to Peck discloses an electrical box having a detachable divider that can divide the cavity of the electrical box into two different size compartments. The detachable divider is shaped to provide one compartment with a dimension greater than the other.

U.S. Patent Publication No. 2011/0005799 to Drane discloses a dual high voltage electrical floor box. The assembly includes a divider that slides within longitudinal grooves in the floor box. Dividers extend perpendicular to the divider.

U.S. Patent Publication No. 2011/0209913 to Green et al. discloses an electrical box having separate wiring areas for low voltage and line voltage. The electrical box is formed by fixed inner walls to define the high voltage and low voltage areas.

While the prior devices are generally suitable for the intended purpose, there is a continuing need in the industry for an improved electrical box for high and low voltage applications.

SUMMARY OF THE INVENTION

The present invention is directed to an electrical box having a removable divider or partition plate. The invention is particularly directed to an electrical box assembly having a divider that can be mounted in different orientations within the box to form a high voltage compartment and a low voltage compartment.

A primary feature of the invention is to provide an electrical box with a partition plate that can be mounted in different orientations within the box to form two substantially equal size compartments. The compartments are formed for housing high voltage or line voltage wiring and low voltage wiring such as telephone and data lines.

A further feature of the invention is to provide an electrical box and electrical box assembly that can be used or without the partition plate. The electrical box and partition plate are constructed to avoid interference by the mounting assembly for an electrical wiring device when the partition plate is not in use.

Another feature of the invention is to provide an electrical box that can be produced economically where a partition plate can be mounted in the box with minimal effort.

A further feature of the invention is to provide an electrical box having a raised portion for a ground screw where the raised portion can receive a respective ground screw positioned in each of a high voltage compartment and a low voltage compartment. The ground screw also can be used to attach a partition plate in the electrical box to form two separate compartments.

The electrical box assembly of the invention includes an electrical box with a raised portion for a ground screw and a partition plate that is attached directly to the raised portion. The partition plate has a shape to accommodate the raised portion while effectively dividing the electrical box into equal size compartments.

Another feature of the invention provides an electrical box assembly having an electrical box, a partition plate and a cover for the electrical box. The cover has a recess in the form of an open slot for receiving the partition plate to stabilize the partition plate in the electrical box.

The electrical box assembly of the invention includes a cover member for supporting an electrical wiring device and for supporting and positioning a partition plate within the electrical box. The cover member can have a collar extending from a base with an opening for the wiring device. The cover member can be in the form of an extension collar, mud ring or plaster frame.

The various aspects of the invention are attained by providing an electrical box assembly comprising an electrical box having a rear wall, a side wall extending from the rear wall and defining an open end. A cover member is coupled to the open end of the electrical box. The cover member has an inner edge defining a central opening with a dimension to receive an electrical wiring device. A partition plate has a bottom end coupled to the rear wall of the electrical box and a top end coupled to the cover member. The partition plate is selectively coupled to the rear wall in a first position to form two substantially equal size compartments in the electrical box and a second position perpendicular to the first position to form two substantially equal size compartments in the electrical box.

The features of the invention are further attained by providing an electrical box assembly, comprising a substantially square electrical box having a rear wall, a side wall extending from the rear wall and defining an open end. A cover member is coupled to the open end of the electrical box. The cover member has a shape and dimension to couple to the electrical box in a first orientation and a second orientation perpendicular to the first orientation. The cover member has an inner edge defining a central opening with a dimension to receive an electrical wiring device. The inner edge has a first slot and a second slot. A partition plate has a bottom edge coupled to the rear wall and a top edge received in the slots in the cover member. The partition plate is selectively coupled to the rear wall in a first position or a second position perpendicular to the first position. The partition plate divides the electrical box into two substantially equal size compartments in the first and second positions.

The features of the invention are also attained by providing an electrical box assembly, comprising an electrical box having a rear wall, a side wall extending from the rear wall and an open top end opposite the rear wall. The electrical box has a substantially equal length and width. The rear wall has a central emboss extending into the electrical box and has a first screw hole and a second screw hole. A cover member is adapted to be coupled to the open top end of the electrical box in a first position and in a second position perpendicular to the first position. The cover member has an inner edge defining a central opening with a dimension to receive an electrical wiring device. The inner edge has a plurality of apertures for receiving mounting screws of the wiring device, a first recess on a first side of the inner edge and a second recess on a second side of the inner edge. A partition plate is adapted for mounting in the electrical box in a first orientation and a second orientation perpendicular to the first orientation to form two substantially equal size compartments. The partition plate has a bottom edge with a recess having a dimension to accommodate the central emboss and having a tab with a screw hole for aligning with one of the screw holes in the central emboss. The partition plate further has a top edge adapted for being received in the recesses and the central opening.

These and other advantages and salient features of the invention will become apparent from the following detailed description of the invention which, taken in conjunction with the annexed drawings, disclose preferred embodiments of the invention.

BRIEF DESCRIPTION OF THE DRAWINGS

The following is a brief description of the drawings, in which

FIG. 11 is a front elevational view of the partition plate;

FIG. 12 is an end view of the partition plate; and

FIG. 13 is a bottom perspective view of the partition plate.

DETAILED DESCRIPTION OF THE INVENTION

Figure 1:
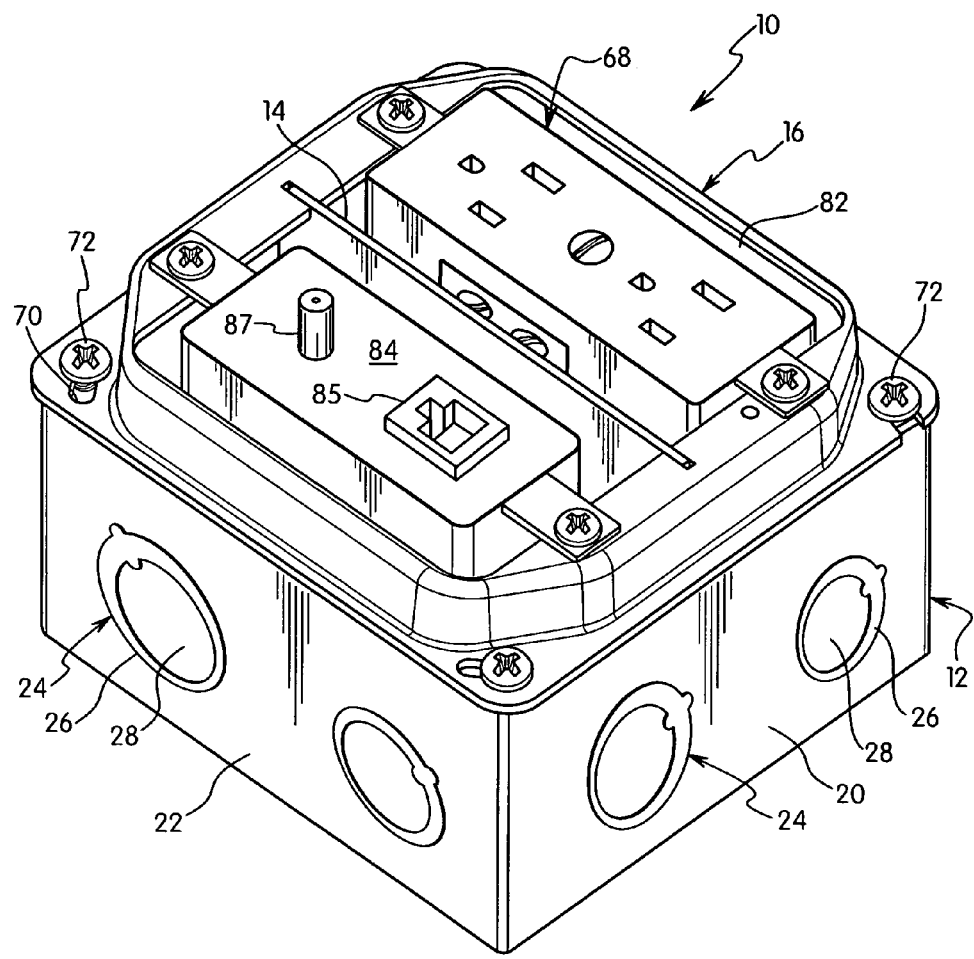
FIG. 1 is a perspective view of the electrical box assembly.

The present invention is directed to an electrical box and to an electrical box assembly having a removable partition plate. The invention is particularly directed to an electrical box assembly having a partition plate that can be mounted in different orientations with respect to the electrical box to form two separate compartments in the electrical box.

Referring to the drawings, the electrical box assembly 10 includes an electrical box 12, a partition plate 14, and a cover member 16. The electrical box 12 in a preferred embodiment as shown has a substantially square configuration with a rear wall 18 and side walls 20. Each of the side walls 20 has substantially the same width and height and are joined to the rear wall 18. The electrical box 12 preferably has a length substantially equal to its width. In one embodiment of the invention, the side walls 20 are integrally formed with the rear wall 18 and extend upwardly perpendicular to the rear wall. The side walls can be ganged together to form a multigang assembly. Removable end walls 22 can be coupled to the side walls 20 by screws, welds, or other fasteners as known in the art to form the electrical box enclosure. Alternatively, the electrical box 12 can be formed as a single one-piece unitary unit.

The side walls and end walls of the electrical box have a plurality of knock-outs or pry-outs 24 for accessing the interior of the electrical box. In the embodiment shown, the knock-outs 24 include two eccentric knock-outs 26 and 28 to provide different size openings to the electrical box. In the embodiment shown, the end walls 22 have a top edge 30 with inwardly extending tabs 32 having threaded holes 33 for coupling the cover member 16 to the electrical box 12.

Figure 2:
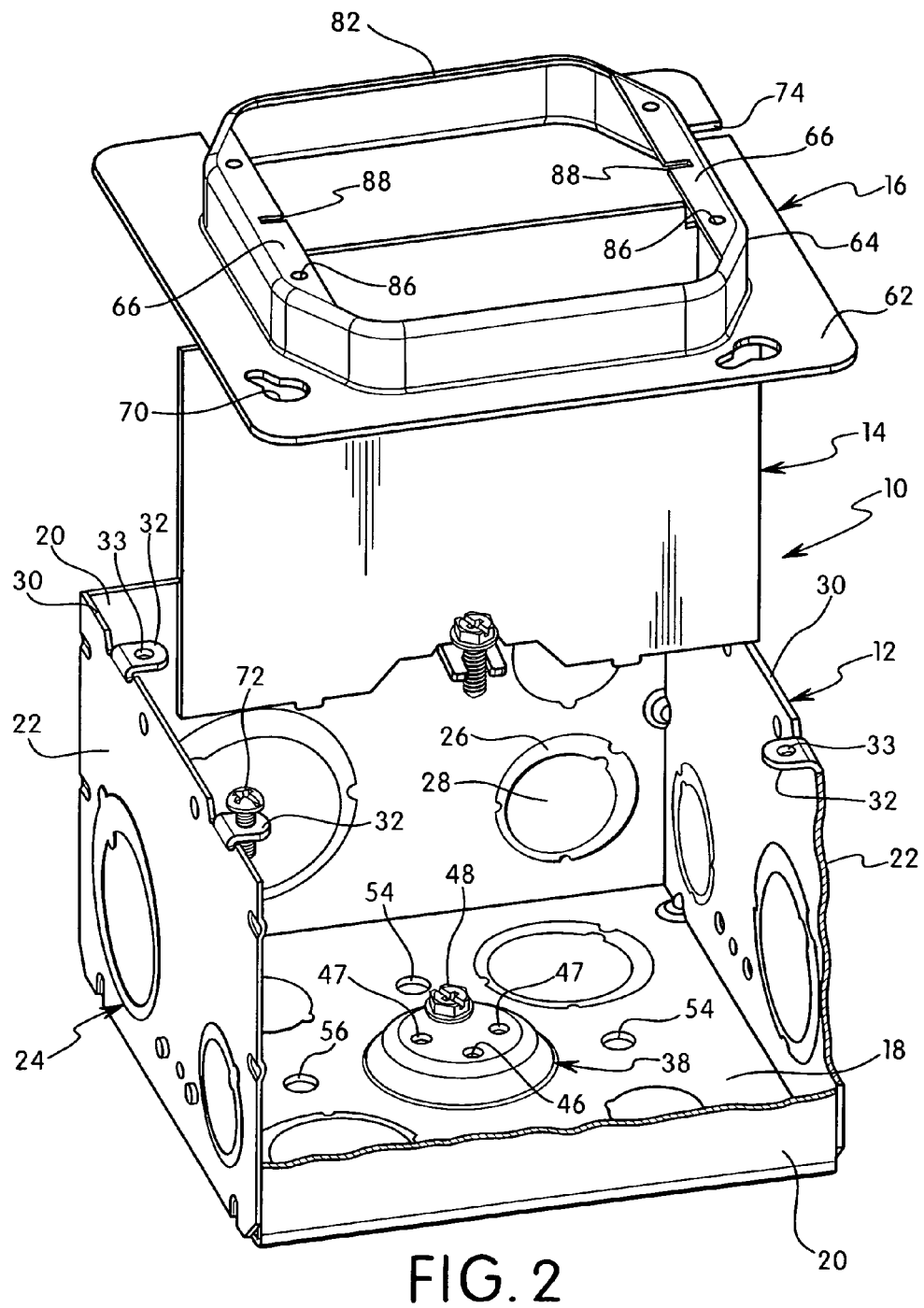
FIG. 2 is an exploded perspective view of the electrical box assembly of FIG. 1.
Figure 3:
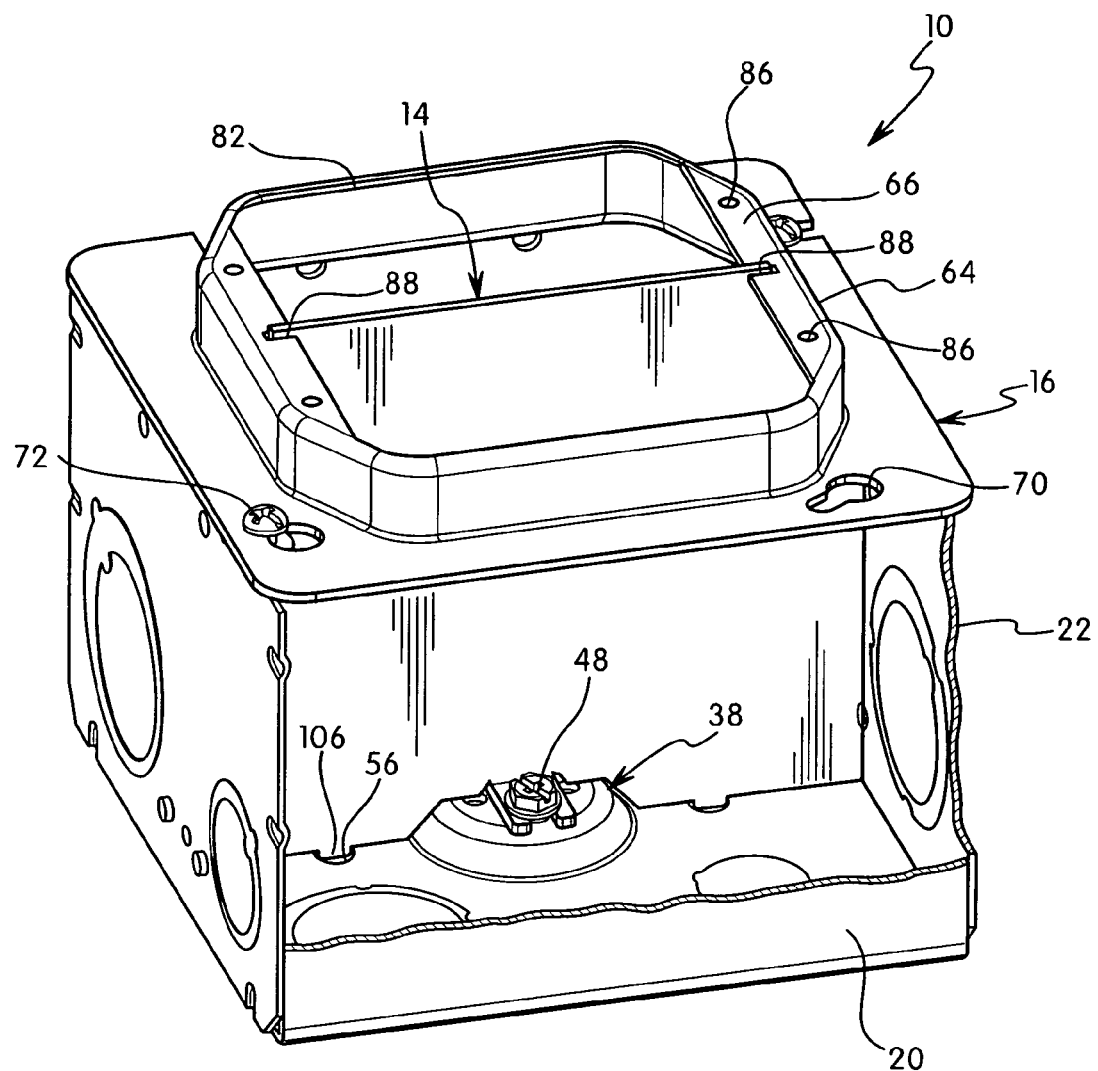
FIG. 3 is a perspective view of the electrical box assembly showing the side wall cut away.

The rear wall 18 also has a plurality of knock-outs for supplying electrical wiring to the electrical box. In the embodiment shown, the rear wall 18 has two smaller knock-outs 34 in opposite corners of the electrical box and larger knock-outs 36 in the two opposing corners. A centrally located emboss 38 extends upwardly from the rear wall 18 into the cavity 40 of the electrical box 12. Preferably, the emboss 38 is oriented in the center of the rear wall 18 equidistant from the side walls 20 and end walls 22. The emboss 38 in the embodiment shown has a substantially circular configuration. In alternative embodiments, the emboss can be square or other shapes as desired. As shown in FIGS. 2 and 3, the emboss 38 has an inclined side face 42 and a top face 44. The top face 44 is substantially flat and parallel to the rear wall 18. The top face 44 includes a plurality of screw holes 46 for receiving a ground screw 48. In a preferred embodiment of the invention, four screw holes 46 and 47 are provided in the top face 44 of the emboss 38. The emboss 38 preferably has a height corresponding to the length of the ground screws so that when inserted into the screw holes, the ends of the screws do not extend past the rear wall 18.

Figure 4:
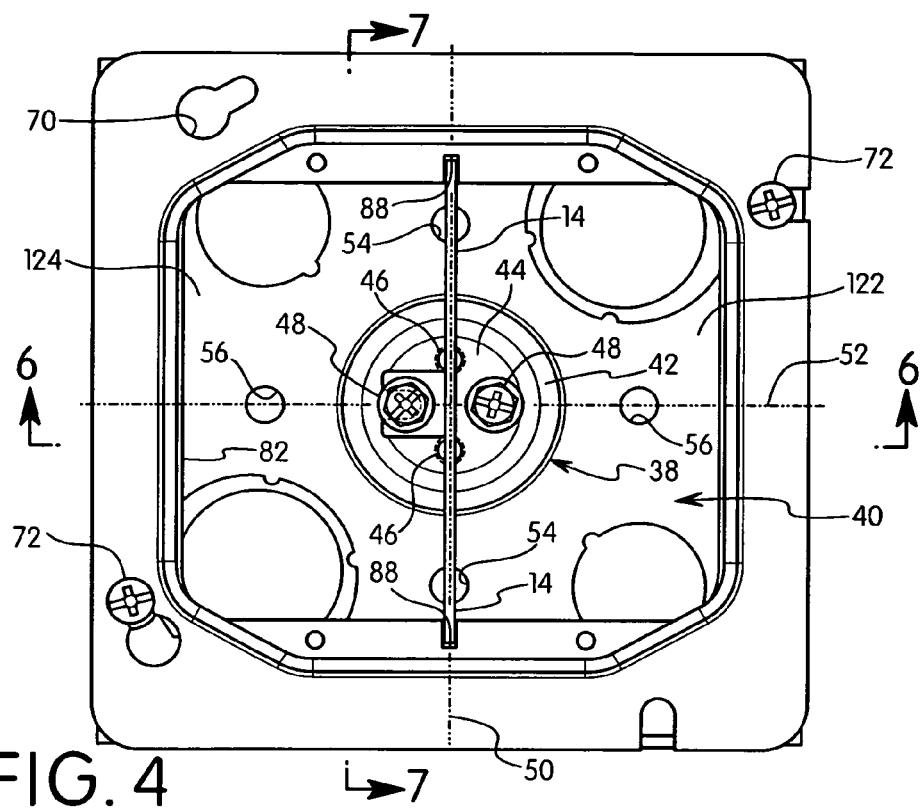
FIG. 4 is a top view of the electrical box assembly showing the partition plate in a first orientation.
Figure 5:
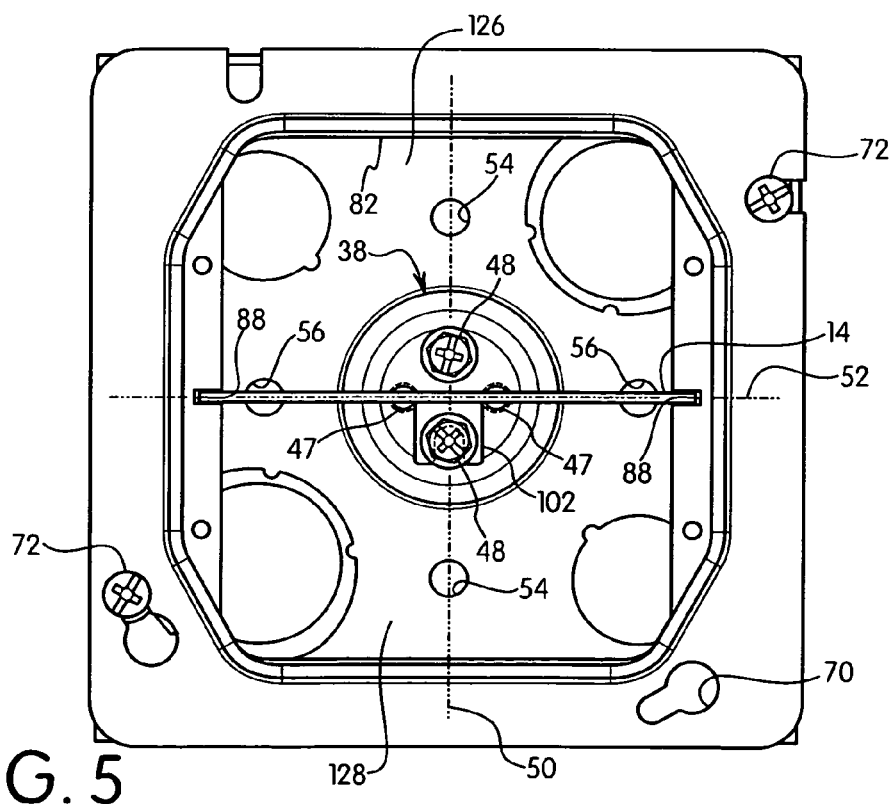
FIG. 5 is a top view of the electrical box assembly showing the partition plate in a second orientation.
Figure 9:
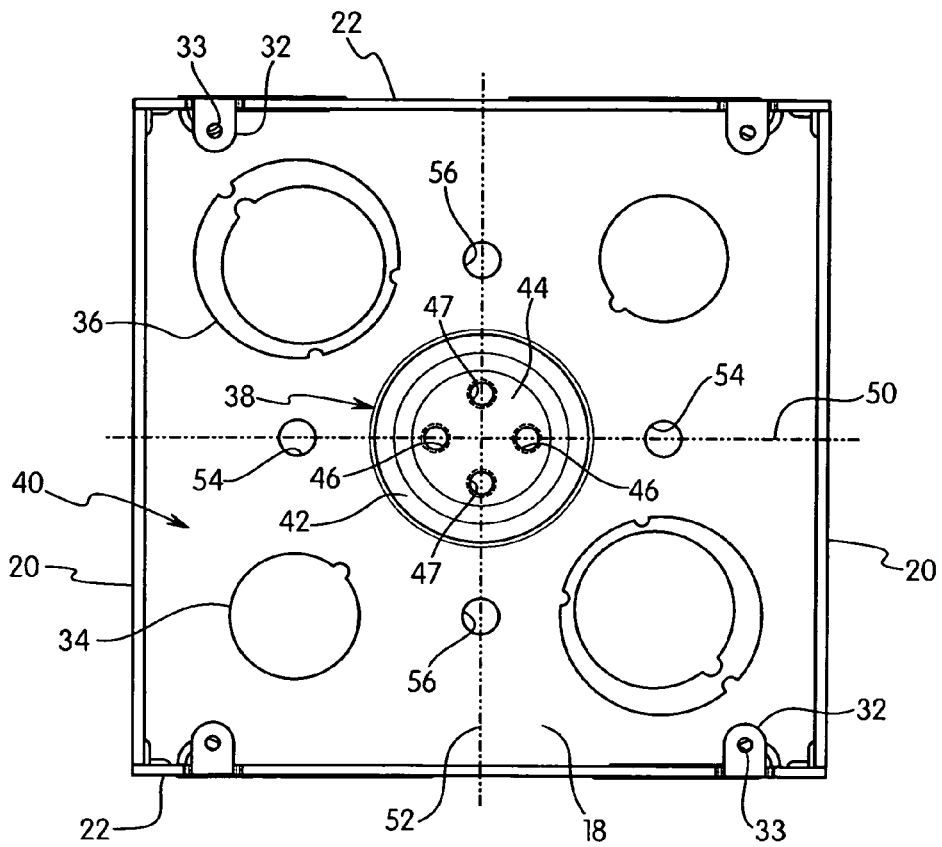
FIG. 9 is a top view of the electrical box.
Figure 10:
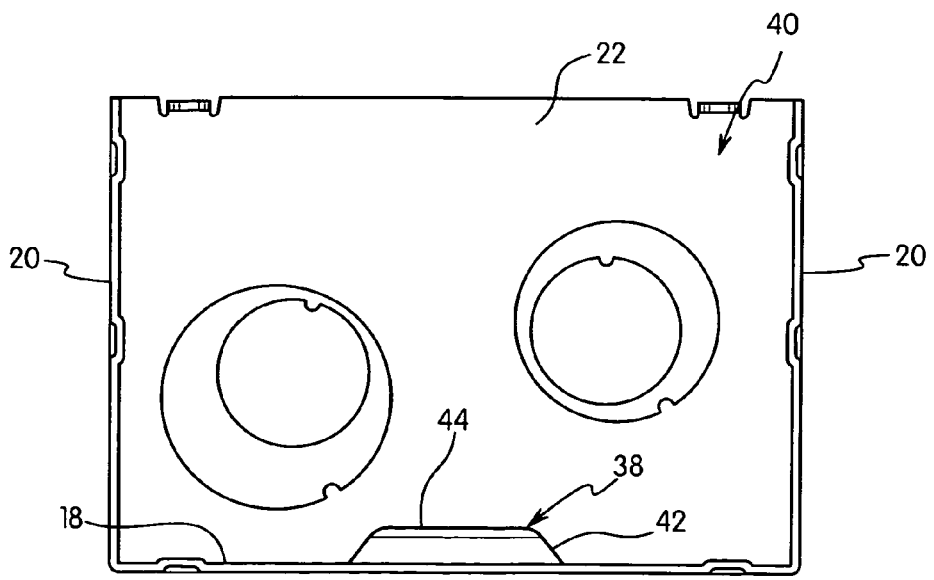
FIG. 10 is a side view of the electrical box with the side wall removed.

The screw holes 46 and 47 are spaced equally apart from one another and are spaced from a respective side wall 20 and end wall 22 an equal distance. Preferably, two of the screw holes 46 are aligned along a center line 50 between the side walls 20 and spaced from a center line 52 extending between the end walls 22 a distance so that the partition plate 14 can be positioned on the center line 50 as shown in FIG. 4. Two screw holes 46 are also aligned with the center line 52 and spaced a distance from the center line 52 so that the partition plate can be positioned on the center line 52 as shown in FIG. 5. The rear wall also includes apertures 54 aligned with the screw holes 46 on the center line 50 and spaced outwardly from the emboss 38. Apertures 56 are also provided in the rear wall 18 spaced outwardly from the emboss 38 and aligned with the center line 52 as shown in FIG. 9. As shown in FIG. 4 and FIG. 9, center line 50 is substantially perpendicular to center line 52. Preferably, the emboss 38 is located in the center of the electrical box spaced equidistant from the side walls and end walls. The respective screw holes and apertures 54 and 56 are also preferably spaced equally from the respective side wall and end wall.

Referring to FIGS. 1-3, cover member 16 includes a base 62 and inwardly extending flanges 66 that extend inwardly from opposite sides of a collar 64 extending upright from the plane of the base 62. The cover member and collar 64 define a mud ring or extension ring to support the electrical device 68 and space the electrical device 68 from the top edge of the electrical box 12. The base 62 includes keyhole shaped openings 70 for receiving a coupling screw 72 and a slot 74 for attaching the cover member 16 to the electrical box 12 as shown in FIG. 1 and FIG. 3.

In the embodiment shown, the collar 64 includes side walls 76 and end walls 78 with corner walls 80 extending between the end wall and respective side wall 76. The flanges 66 extend inwardly from the respective end walls 78 a distance to support the electrical device 68 and define a central opening 82 in the cover member 16 with a dimension to receive and support the electrical device 68.

In the embodiment shown, the electrical device 68 is a duplex receptacle. Alternatively, the electrical device 68 can be a switch or other electrical wiring device. The cover member 16 is also adapted for supporting a low voltage wiring device 84 having suitable connectors such as telephone or data jack 85, or cable connections 87.

The flanges 66 include a pair of screw holes 86 for supporting the wiring device 68 and 84. A recess 88 forming a slot extends from the central opening 82 in the flange 66 to receive the partition plate 14 as shown in FIG. 1.

The partition plate 14 as shown in FIG. 11 has a planar configuration with a shape corresponding to the profile of the cavity 40 of the electrical box 12 and the inner surface of the cover member 16. Partition plate 14 has parallel ends 92 with a height corresponding to the height of the side walls 20 and end walls 22 of the electrical box 12. A bottom edge 94 has a recess 96 with a shape complementing the shape of the emboss 38. As shown in FIG. 11, the recess 96 has an inclined surface 98 complementing the inclined face 42 of the emboss 38 and an inner edge 100 complementing the top face 44 of the emboss 38. The inner edge 100 includes a tab 102 having a slot 104 for receiving the screw 48. The bottom edge 94 includes two outwardly extending detents 106 spaced outwardly from the recess 96.

Figure 6:
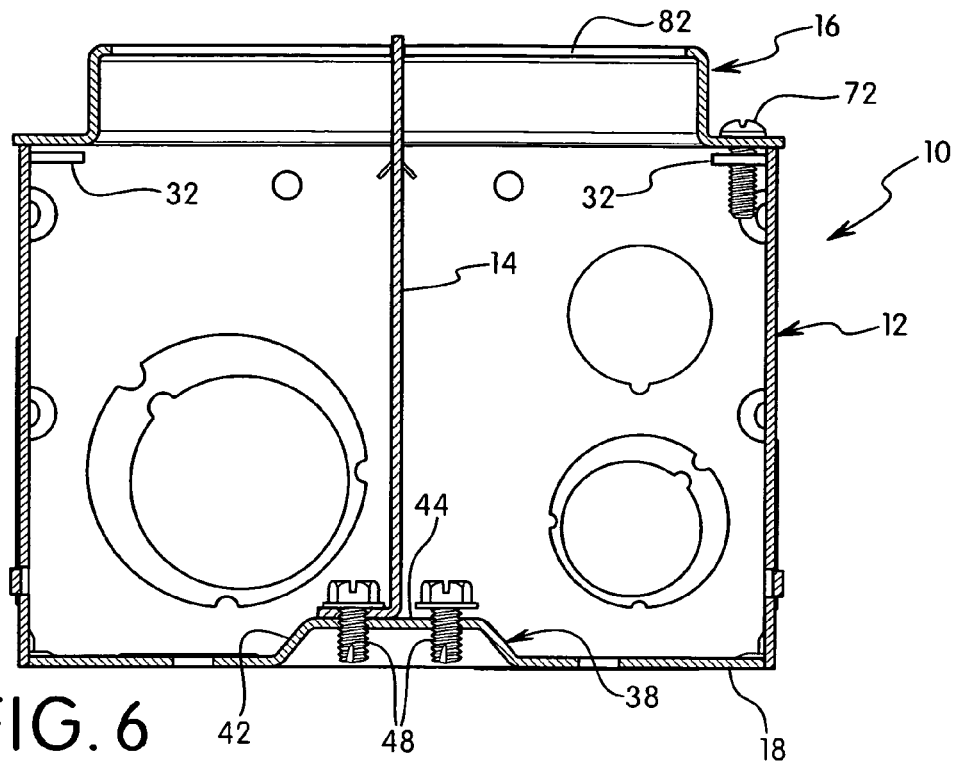
FIG. 6 is a cross-sectional view taken along line 6-6 of FIG. 4.
Figure 7:
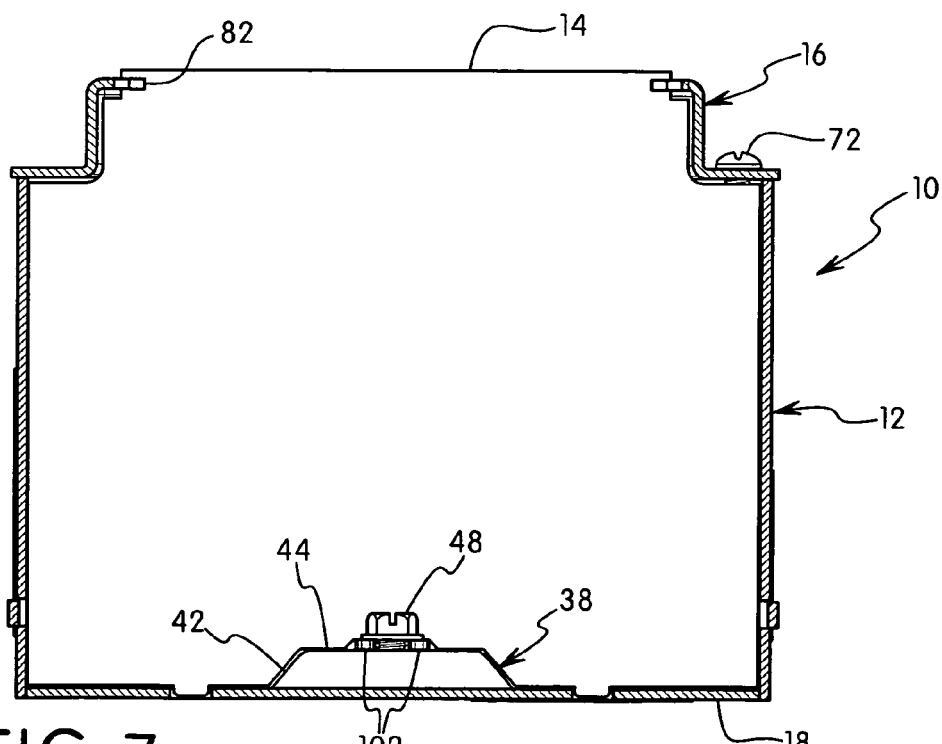
FIG. 7 is a cross-sectional view taken along line 7-7 of FIG. 4.
Figure 8:
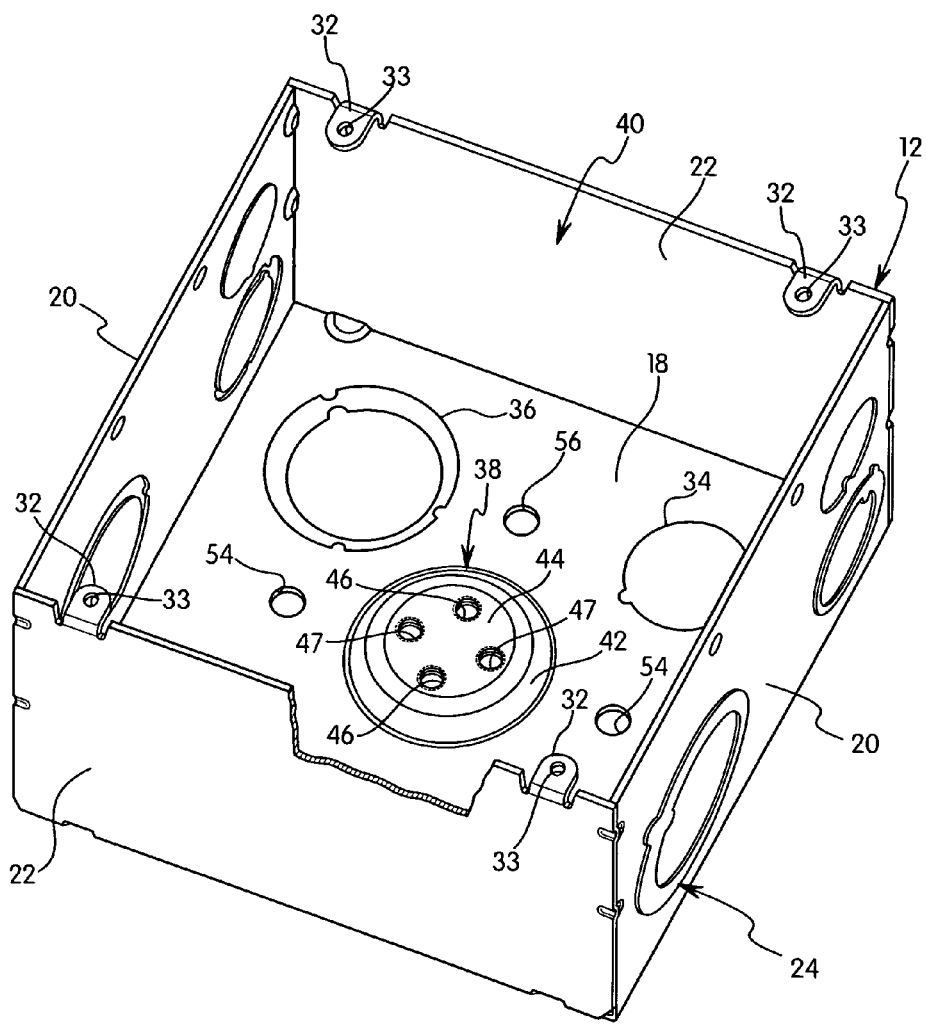
FIG. 8 is a perspective view of the electrical box without the partition plate.

The partition plate 14 includes a top edge 108 having a length to extend between the flanges 66 of the cover member 16. As shown in FIG. 11, the top end of the partition plate 14 has a profile corresponding to the inner profile of the cover member. The corners of the partition plate 14 have a first notch 110 having a base to complement the inner face of base 62 of the cover member 16 and an upwardly extending edge 14 to complement the height and inner face of the collar 64. A second notch 116 is formed to enable the top edge 108 to extend through the recesses 88 in the flanges 66 of the cover member 16. Each notch 116 is formed by a bottom edge 118 that mates with the bottom surface of the respective flange 66 and an upwardly extending edge 120. As shown in FIGS. 6 and 7, the top edge 106 of the partition plate extends above the top of the flanges 82 a slight distance.

Referring to FIGS. 4 and 5, the cover member 16 and the partition plate 14 have a dimension for mounting and attaching to the electrical box 12 in two different perpendicular orientations. The base 62 of the cover member 16 is substantially square complementing the shape of the electrical box 12. The partition plate 14 is coupled to the cover member 16 and also can be mounted in two perpendicular directions with respect to the electrical box as shown in FIGS. 4 and 5. As shown in FIG. 4, the cover member 16 and the partition plate 14 can be mounted so that the partition plate 14 extends along the center line 52 to divide the electrical box into two substantially equal compartments 122 and 124 along the respective center line 50 and 52. The compartments 122 and 124 can be used to mount high voltage electrical devices and low voltage electrical devices as known in the art. The cover member 16 and the partition plate 14 can also be attached to the electrical box so that the partition plate 14 extends along the center line 52 as shown in FIG. 5 to form two substantially equal size compartments 126 and 128. The partition plate 14 also divides the central opening 82 of the cover member 16 into two symmetrical and equal size openings.

As shown in FIGS. 6 and 7, the partition plate 14 has a width to extend between the side walls 20 of the electrical box and a height corresponding to the height of the side walls 20 and the cover member 16. In the embodiment shown in FIGS.

6 and 7, the partition plate has a height to extend a slight distance above the top face of the cover member 16. In one preferred embodiment, the partition plate 14 is coupled directly to the rear wall and emboss 38 of the electrical box. As shown, the ends of the partition plate 14 are fitted close to the inner surface of the side walls or end walls of the electrical box but are not coupled directly to the side or end walls of the electrical box.

The detents 106 in the bottom edge of the partition plate 14 are positioned to align with the apertures 54 and 56 so that the detents 106 are received within a respective aperture when the partition plate 14 is coupled to the electrical box as shown in FIG. 3. The detents 106 stabilize the partition plate 14 and resist rotational movement of the partition plate 14 with respect to the rear wall 18 about the ground screw 48. The tab 102 and slot 104 align with the screw holes 46 in the emboss 38. The screw 48 is threaded into the screw hole 46 to couple the partition plate to the rear wall 18 of the electrical box 12.

As shown in FIGS. 4 and 5, the partition plate 14 is coupled to the rear wall 18 by a ground screw 48. The screw holes 46 and 47 are oriented along the center lines so that each compartment has at least one exposed screw hole 47 when the partition plate 14 is oriented in the position shown in FIG. 4 and one screw hole 46 is exposed when the partition plate 14 is in the position shown in FIG. 5. The emboss 38 and the screw holes 46 are symmetrical so that the partition plate 14 divides the electrical box into two equal size compartments regardless of the orientation of the partition plate 14 with respect to the electrical box. Each compartment has at least one ground screw 48 available for grounding the electrical wiring device. The top end of the partition plate 14 is received within the slots 88 of the flanges 66 to stabilize the top end and to fix the position of the top end with respect to the cover member 16.

While various embodiments have been chosen to illustrate the invention, it will be understood by those skilled in the art that various changes and modifications can be made without departing from the scope of the invention as defined in the appended claims.

What is claimed is:

1. An electrical box assembly comprising:
an electrical box having a rear wall, a side wall extending from said rear wall and defining an open end;
a cover member coupled to said open end of said electrical box, said cover member having a flange extending inwardly from opposite sides of said cover member with an inner edge defining a central opening with a dimension to receive an electrical wiring device, said inner edge having a first slot and a second slot extending from said central opening; and
a partition plate having a bottom end with a tab coupled to said rear wall of said electrical box and a top end received in said slots and central opening of said cover member, said partition plate being selectively coupled to said rear wall in a first position to form two substantially equal size compartments in said electrical box and a second position perpendicular to said first position to form two substantially equal size compartments in said electrical box.

2. The assembly of claim 1, wherein
said electrical box has a substantially equal width and length, and where said partition plate has a length to extend between opposing walls of the electrical box and a height to extend between said rear wall and a bottom face of said cover member.

3. The assembly of claim 1, wherein
said cover member has a dimension corresponding to a dimension of said electrical box, and where said cover member is adapted to be coupled to said electrical box in a first orientation and in a second orientation perpendicular to said first orientation.

4. The assembly of claim 1, wherein
said rear wall includes a centrally located emboss extending into a cavity of said electrical box, said emboss having a plurality of screw holes oriented along a center line of said electrical box, and
said partition having a recess in a bottom edge thereof adapted for mating with said emboss.

5. The assembly of claim 4, wherein
said partition plate has a coupling tab in said recess for coupling to said emboss.

6. The assembly of claim 4, wherein
said bottom edge of said partition plate has at least one detent received in an aperture in said rear wall to stabilize said partition plate.

7. The assembly of claim 1, wherein
said top edge of said partition plate has a first notch at a first end received in said first recess and a second notch at a second end received in said second recess.

8. An electrical box assembly, comprising:
a substantially square electrical box having a rear wall, a side wall extending from said rear wall and defining an open end;
a cover member coupled to said open end of said electrical box, said cover member having a shape and dimension to couple to said electrical box in a first orientation and a second orientation perpendicular to said first orientation, said cover member having an inner edge defining a central opening with a dimension to receive an electrical wiring device, said inner edge having a first slot and a second slot; and
a partition plate having a bottom edge coupled to said rear wall and a top edge received in said slots in said cover member, said partition plate being selectively coupled to said rear wall in a first position and a second position perpendicular to said first position, said partition plate dividing said electrical box into two substantially equal size compartments in said first and second positions; and
said electrical box having a centrally located raised emboss in said rear wall, said emboss being located to be partially positioned in each said compartments.

9. The assembly of claim 8, wherein
said emboss has at least one screw hole positioned on a first center line extending through said emboss and electrical box, and at least one aperture spaced outwardly from said emboss and positioned on said center line;
said partition plate having a centrally located recess in a bottom edge for receiving said emboss.

10. The assembly of claim 9, wherein
said bottom edge of said partition plate has a projecting detent received in said at least one aperture in said rear wall.

11. The assembly of claim 8, wherein
said partition plate having a top edge with a first corner received in said first slot and a second corner received in said second slot.

12. The assembly of claim 11, wherein
said first corner having a notch therein for mating with said first slot; and
said second corner having a notch therein for mating with said second slot.

13. The assembly of claim 9, wherein
said partition plate having a coupling tab on a bottom edge for coupling to said emboss.

14. The assembly of claim 13, further comprising
a ground screw adapted for extending through said coupling tab in said partition plate and received in said at least one screw hole in said emboss and where said partition plate is aligned with a second center line perpendicular to said first center line.

15. The assembly of claim 14, wherein
said emboss has at least one second screw hole aligned with said second center line, and where said ground screw is adapted for extending through said coupling tab in said partition plate and received in said second screw hole to align said partition plate along said first center line.

16. An electrical box assembly, comprising:
an electrical box having a rear wall, a side wall extending from said rear wall and an open top end opposite said rear wall, said electrical box having a substantially equal length and width, said rear wall having a central emboss extending into said electrical box and having a first screw hole and a second screw hole;
a cover member adapted to be coupled to said open top end of said electrical box in a first position and in a second position perpendicular to said first position, said cover member having an inner edge defining a central opening with a dimension to receive an electrical wiring device, said inner edge having a plurality of apertures for receiving mounting screws of the wiring device, a first recess on a first side of said inner edge and a second recess on a second side of said inner edge; and
a partition plate adapted for mounting in said electrical box in a first orientation and a second orientation perpendicular to said first orientation to form two substantially equal size compartments, said partition plate having a bottom edge with a recess having a dimension to accommodate said central emboss and having a tab with a screw hole for aligning with one of said screw holes in said central emboss, said partition plate further having a top edge adapted for being received in said recesses and said central opening.

17. The assembly of claim 16, said partition plate further comprising
a first notch provided in a first corner of said top edge and received in said first recess in said cover member; and
a second notch provided in a second corner of said top edge and received in said second recess in said cover member.

18. The assembly of claim 16, said rear wall further comprising
at least one aperture spaced outwardly from said central emboss, and where said bottom edge of said partition member has a projecting detent received in said at least one aperture.

19. The assembly of claim 16, said cover member further comprising
a base for coupling to said electrical box;
a collar extending upwardly from said base defining said central opening; and
an inwardly extending flange extending into said central opening and first and second recesses are formed in said flange.

20. An electrical box assembly comprising:
an electrical box having a rear wall with an emboss extending into a cavity of said electrical box, a side wall extending from said rear wall and defining an open end; and
a partition plate having a bottom edge with a recess for mating with said emboss and coupled to said rear wall of said electrical box, and a top end coupled to said electrical box, said partition plate being coupled to said rear wall in a first position to form two compartments in said electrical box.

21. The assembly of claim 20, further comprising
a cover member coupled to said open end of said electrical box, said cover member having an inner edge defining a central opening with a dimension to receive an electrical wiring device, and
where said top end of said partition plate is coupled to said cover member, and said partition plate is configured for coupling to said rear wall in a second position to form two compartments in said electrical box.

22. The assembly of claim 20, wherein
said electrical box has a substantially equal width and length, and where said partition plate has a length to extend between opposing walls of the electrical box and a height to extend between said rear wall and a bottom face of said cover member.

23. The assembly of claim 20, wherein
said emboss having a plurality of screw holes; and
said partition plate having a tab with a screw hole receiving a ground screw for coupling said partition plate to said emboss.

24. The assembly of claim 22, wherein
said screw holes in said emboss are oriented along a center line of said electrical box.

25. The assembly of claim 20, wherein
said top edge of said partition plate has a first notch at a first end received in said first slot and a second notch at a second end received in said second slot.

26. The assembly of claim 20, wherein
said emboss is centrally located in said rear wall to be partially positioned in each of said compartments.

* * * * *